United States Patent
Kim et al.

(10) Patent No.: US 11,367,679 B2
(45) Date of Patent: Jun. 21, 2022

(54) SEMICONDUCTOR PACKAGE INCLUDING AN IN INTERPOSER AND METHOD OF FABRICATING THE SAME

(71) Applicant: SAMSUNG ELECTRONICS CO., LTD., Suwon-si (KR)

(72) Inventors: Ji Hwang Kim, Cheonan-si (KR); Hyunkyu Kim, Yongin-si (KR); Jongbo Shim, Asan-si (KR); Eunhee Jung, Hwaseong-si (KR); Kyoungsei Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/017,638

(22) Filed: Sep. 10, 2020

(65) Prior Publication Data
US 2021/0183757 A1   Jun. 17, 2021

(30) Foreign Application Priority Data

Dec. 11, 2019   (KR) .................. 10-2019-0165011

(51) Int. Cl.
| | |
|---|---|
| *H01L 23/498* | (2006.01) |
| *H01L 23/31* | (2006.01) |
| *H01L 25/065* | (2006.01) |
| *H01L 23/00* | (2006.01) |

(52) U.S. Cl.
CPC .... *H01L 23/49838* (2013.01); *H01L 23/3128* (2013.01); *H01L 24/13* (2013.01); *H01L 24/45* (2013.01); *H01L 25/0657* (2013.01)

(58) Field of Classification Search
CPC ................................. H01L 23/49838
See application file for complete search history.

(56) References Cited

U.S. PATENT DOCUMENTS

| | | | |
|---|---|---|---|
| 6,770,961 | B2 | 8/2004 | Lee |
| 6,894,229 | B1 | 5/2005 | Cheah |
| 7,741,726 | B2 | 6/2010 | Jeon et al. |
| 7,989,947 | B2 | 8/2011 | Otani |
| 8,273,607 | B2 | 9/2012 | Park et al. |
| 8,399,297 | B2 | 3/2013 | Yean et al. |
| 9,665,122 | B2 | 5/2017 | Kwon et al. |
| 10,049,964 | B2 | 8/2018 | Shim et al. |
| 10,121,774 | B2 | 11/2018 | Ko |
| 2002/0173074 | A1 | 11/2002 | Chunwen |
| 2010/0148344 | A1* | 6/2010 | Chandra ............. H01L 23/5385 257/690 |
| 2014/0312481 | A1* | 10/2014 | Choi ....................... H01L 25/50 257/686 |

* cited by examiner

*Primary Examiner* — William A Harriston
(74) *Attorney, Agent, or Firm* — F. Chau & Associates, LLC

(57) ABSTRACT

A semiconductor package includes a lower package, an interposer on the lower package, and an under-fill layer between the interposer and the lower package. The interposer includes a through hole that vertically penetrates the interposer. The under-fill layer includes an extension that fills at least a portion of the through hole.

20 Claims, 16 Drawing Sheets

SEMICONDUCTOR PACKAGE INCLUDING AN IN INTERPOSER AND METHOD OF FABRICATING THE SAME

CROSS-REFERENCE TO RELATED APPLICATION

This U.S. nonprovisional application claims priority under 35 U.S.C § 119 to Korean Patent Application No. 10-2019-0165011 filed on Dec. 11, 2019 in the Korean Intellectual Property Office, the disclosure of which is hereby incorporated by reference in its entirety.

TECHNICAL FIELD

The present inventive concepts relate to a semiconductor package, and more particularly, to a semiconductor package including an interposer and a method of fabricating the same.

DISCUSSION OF THE RELATED ART

In the semiconductor industry, semiconductor devices and their electronic products increasingly require high performance, rapid operating speeds, and compact sizes. Numerous stacking methods have been developed to address these requirements. For example, a plurality of semiconductor chips may be stacked on a single substrate or one package may be stacked on another package.

According to one approach, a package-on-package (PoP) technique has been developed in which various semiconductor chips are vertically stacked to implement high-density chip stacking. The package-on-package technique may be used to integrate semiconductor chips having various functions on a smaller area than a conventional package that includes only one semiconductor chip.

SUMMARY

According to some example embodiments of the present inventive concepts, a semiconductor package includes a lower package, an interposer disposed on the lower package, and an under-fill layer disposed between the interposer and the lower package. The interposer includes a through hole that vertically penetrates the interposer. The under-fill layer includes an extension that fills at least a portion of the through hole.

According to some example embodiments of the present inventive concepts, a semiconductor package includes a lower package, an upper package disposed on the lower package, an interposer disposed between the lower package and the upper package, and an under-fill layer that fills at least a portion of the through hole and also fills a gap between the interposer and the lower package. The interposer includes at least one through hole that vertically penetrates the interposer. An uppermost part of the under-fill layer is exposed through the through hole.

According to some example embodiments of the present inventive concepts, a semiconductor package includes a lower package substrate, a lower semiconductor chip mounted on the lower package substrate, a lower molding member covering a lateral surface of the lower semiconductor chip, an interposer disposed on the lower semiconductor chip, a plurality of first connection terminals disposed between the interposer and the lower package substrate, and an under-fill layer that fills at least a portion of the through hole and covers the first connection terminals, a top surface of the lower semiconductor chip, and a top surface of the lower molding member. The interposer includes a through hole that vertically penetrates the interposer. The first connection terminals at least partially surround the lower semiconductor chip.

According to some example embodiments of the present inventive concepts, a method of fabricating a semiconductor package includes mounting a plurality of lower semiconductor chips on a substrate, forming a lower molding member that covers a lateral surface of each of the lower semiconductor chips, mounting an interposer on each of the lower semiconductor chips, and introducing an under-fill material through the through hole to the interposer. The interposer includes a through hole that vertically penetrates the interposer. The under-fill material at least partially fill a first gap between the interposer and the lower molding member.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

The following will now describe a semiconductor package and a method of fabricating the same according to the present inventive concept with reference to accompanying drawings.

Figure 1A:
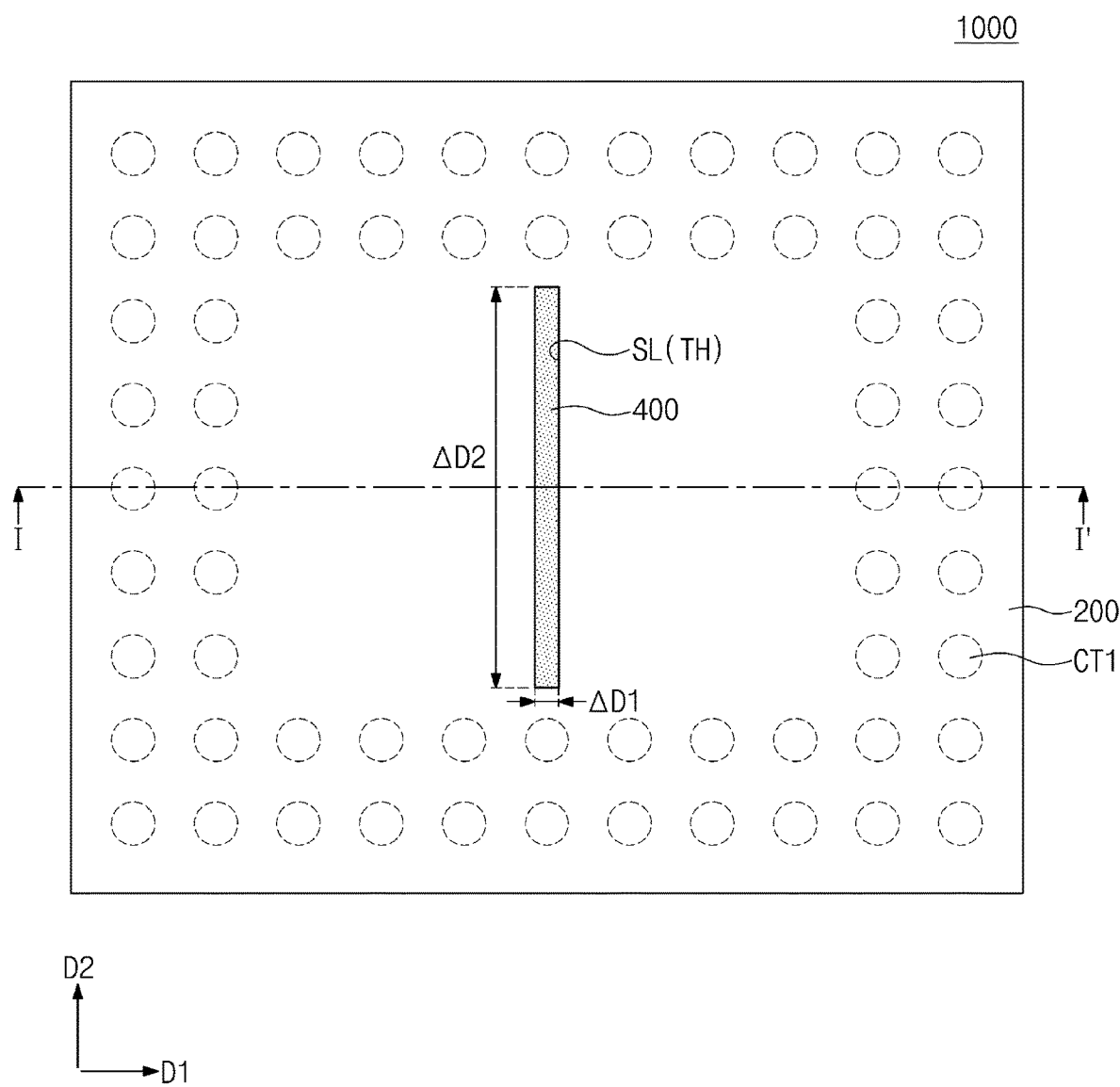
FIG. 1A is a plan view illustrating a semiconductor package according to some example embodiments of the present inventive concepts.
Figure 1B:
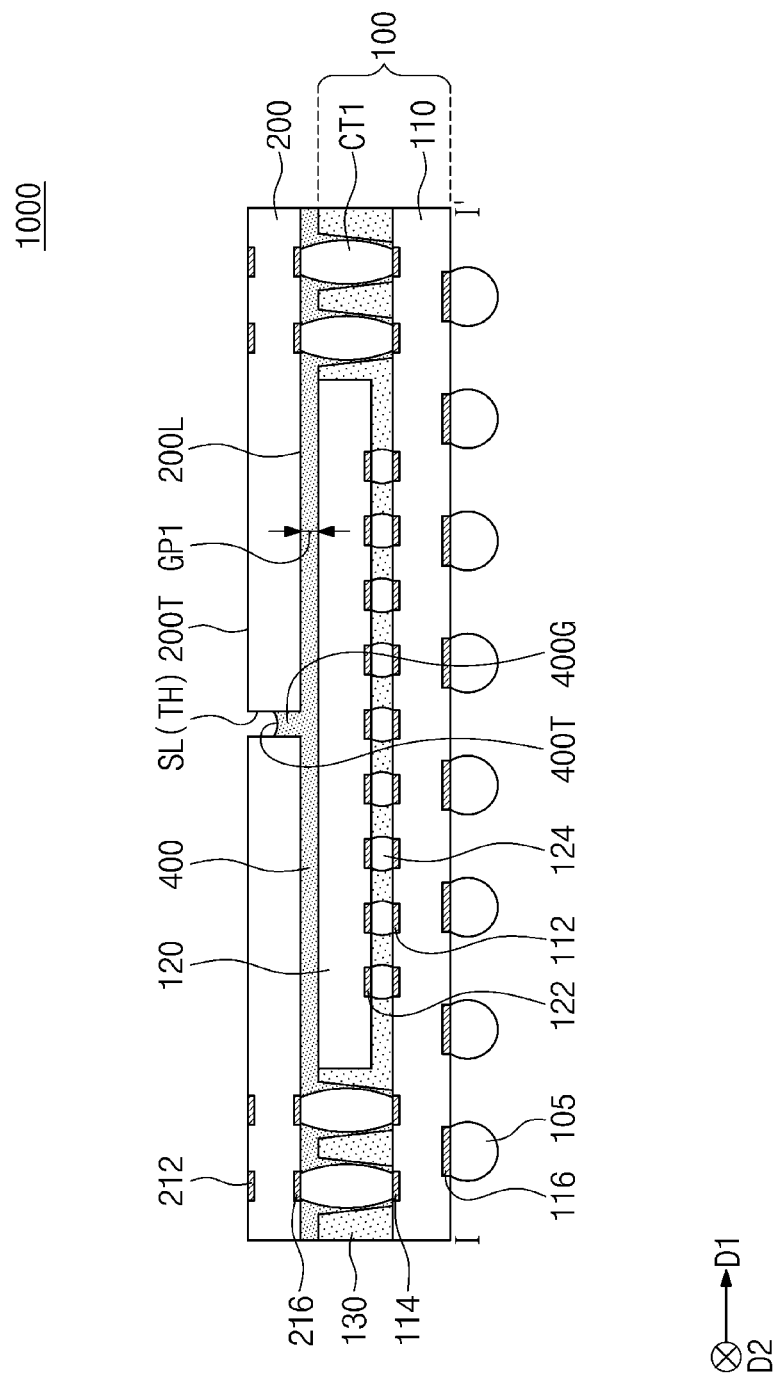
FIG. 1B is a cross-sectional view taken along line I-I' of FIG. 1A.

FIG. 1A is a plan view illustrating a semiconductor package according to some example embodiments of the present inventive concepts. FIG. 1B is a cross-sectional view taken along line I-I' of FIG. 1A. For clarity of description, some components of FIG. 1B have been omitted from FIG. 1A. However, it is to be understood that the structure of FIG. 1A may include all elements shown in FIG. 1B.

Referring to FIGS. 1A and 1B, a semiconductor package 1000, according to some embodiments of the present inventive concepts, may include a lower package 100, an interposer 200, and a plurality of first connection terminals CT1.

The lower package 100 may include a lower package substrate 110, a lower semiconductor chip 120, and a lower molding member 130. The first connection terminals CT1 may be said to surround the lower semiconductor chip 120 and this may mean that the lower semiconductor chip 120 is disposed between two or more of the first connection terminals CT1.

The lower package substrate 110 may be a printed circuit board (PCB) having one or more signal patterns disposed on a top surface thereof. Alternatively, the lower package substrate 110 may have a structure in which at least one dielectric layer and at least one wiring layer are alternately stacked. The lower package substrate 110 may have, on its top surface, first lower substrate pads 112 and second lower substrate pads 114.

External terminals 105 may be disposed below the lower package substrate 110. For example, the external terminals 105 may be disposed on external terminal pads 116 provided on a bottom surface of the lower package substrate 110. The external terminals 105 may include solder balls or solder bumps. Based on the type of the external terminals 105 being used, the lower package 100 may be of a ball grid array (BGA) type, a fine ball-grid array (FBGA) type, and/or a land grid array (LGA) type.

The lower semiconductor chip 120 may be disposed on the lower package substrate 110. In a plan view, the lower semiconductor chip 120 may be disposed on a central portion of the lower package substrate 110. For example, the lower semiconductor chip 120 may be substantially centered within the lower package substrate or the lower semiconductor chip 120 may be otherwise disposed so as not to overlap an edge of the lower package substrate. The lower semiconductor chip 120 may have a bottom surface facing toward the lower package substrate 110 and a top surface opposite to the bottom surface. The bottom surface of the lower semiconductor chip 120 may be an active surface, and the top surface of the lower semiconductor chip 120 may be an inactive surface. The lower semiconductor chip 120 may be mounted on the top surface of the lower package substrate 110. For example, the lower semiconductor chip 120 may be flip-chip mounted on the lower package substrate 110. In this case, the lower semiconductor chip 120 may be electrically connected to the lower package substrate 110 through chip terminals 124, such as by solder balls or solder bumps, disposed on the bottom surface of the lower semiconductor chip 120. The chip terminals 124 may be provided between lower chip pads 122 provided on the bottom surface of the lower semiconductor chip 120 and the first lower substrate pads 112 of the lower package substrate 110.

The present inventive concepts, however, are not limited thereto, and bonding wires may be used to mount the lower semiconductor chip 120 on the lower package substrate 110. In this description, the phrase "electrically connected/coupled to" may include "directly or indirectly electrically connected/coupled to." The lower semiconductor chip 120 may be, for example, a logic chip. The lower semiconductor chip 120 may be a chip that is not a memory chip, such as an application processor.

In some embodiments, there may be multiple lower semiconductor chips 120 disposed on the lower package substrate 110. In such a case, the plurality of lower semiconductor chips 120 may be spaced apart from each other in a first direction D1 and/or a second direction D2. Each of the plurality of lower semiconductor chips 120 may be flip-chip or wire-bonding mounted on the lower package substrate 110.

The lower molding member 130 may be provided on the lower package substrate 110. On the top surface of the lower package substrate 110, the lower molding member 130 may at least partially surround a lateral surface of the lower semiconductor chip 120. For example, the lower molding member 130 may at least partially cover the lateral surface of the lower semiconductor chip 120 and the top surface of the lower package substrate 110. For example, the lower molding member 130 may at least partially cover the top surface of the lower semiconductor chip 120. The lower molding member 130 may include, for example, an epoxy molding compound (EMC).

The interposer 200 may be disposed on the lower semiconductor chip 120 and the lower molding member 130. The interposer 200 may be vertically spaced apart from each of the lower molding member 130 and the lower semiconductor chip 120. For example, a first gap GP1 may be disposed between the interposer 200 and the lower package 100. The first gap GP1 may be within the range of 0 µm to or less than 50 µm, inclusive. The first gap GP1 may be within the range of 0 µm to 30 µm, inclusive. The interposer 200 may include a dielectric substrate and/or a silicon substrate.

The interposer 200 may have a width that is measured in the first direction D1. A top surface 200T of the interposer 200 may extend in the first direction D1. The width in the first direction D1 of the interposer 200 may be greater than a width in the first direction D1 of the lower semiconductor chip 120. In this case, the interposer 200 may protrude over one side of the lower semiconductor chip 120. First pads 216 may be disposed on a lower portion of the interposer 200, and second pads 212 may be disposed on an upper portion of the interposer 200.

The interposer 200 may have a through hole TH that vertically penetrates the interposer 200. The through hole TH may be an opening into which an under-fill material is introduced. The through hole TH will be further discussed in detail below.

The first connection terminals CT1 may be disposed below the interposer 200. In a plan view, the first connection terminals CT1 may be disposed outside of the lower semiconductor chip 120. The first connection terminals CT1 may be coupled to the first pads 216 on the lower portion of the interposer 200. The first connection terminals CT1 may be spaced apart from the lateral surface of the lower semiconductor chip 120. The first connection terminals CT1 may be placed in apertures formed in the lower molding member 130. The apertures may vertically penetrate the lower molding member 130 and may expose the second lower substrate pads 114 of the lower package substrate 110. For example, the first connection terminals CT1 may penetrate the lower molding member 130 and may be coupled to the second lower substrate pads 114 of the lower package substrate 110.

The through hole TH may be positioned on a central portion of the interposer 200. For example, the through hole TH may be substantially centered within the interposer 200. The through hole TH may be located above the lower semiconductor chip 120. The through hole TH may overlap the lower semiconductor chip 120 in a plan view. The through hole TH may be surrounded by the first connection terminals CT1.

The through hole TH may be shaped like, for example, a slit SL. The slit SL may be a narrow elongated hole. The slit SL may have a width ΔD1 in the first direction D1 and a width ΔD2 in the second direction D2. The second direction may run perpendicular to the first direction D1. The slit SL may have an aspect ratio that is equal to or greater than about 1:2. This aspect ratio may be defined as a ratio of the width ΔD1 in the first direction D1 to the width ΔD2 in the second direction D2. For example, the width ΔD1 in the first direction D1 of the slit SL may range from about 100 μm to about 200 μm, inclusive. The width ΔD1 in the first direction D1 of the slit SL may have various values.

An under-fill layer 400 may be disposed between the interposer 200 and the lower package substrate 110. The under-fill layer 400 may at least partially fill the first gap GP1 that is defined between the interposer 200 and the lower package 100.

For example, the under-fill layer 400 may cover the top surface of the lower semiconductor chip 120, a top surface of the lower molding member 130, and lateral surfaces of the first connection terminals CT1. The under-fill layer 400 may be in contact with a bottom surface 200L of the interposer 200 and also in contact with a top surface of the lower package 100.

The under-fill layer 400 may include an extension 400G that fills at least a portion of the through hole TH. An uppermost part 400T of the under-fill layer 400 may correspond to a top surface of the extension 400G. In this description, the reference symbol 400T may indicate not only the uppermost part of the under-fill layer 400, but also the top surface of the extension 400G. The uppermost part 400T of the under-fill layer 400 may be exposed through the through hole TH. The top surface 400T of the extension 400G may be located at a higher level than that of the bottom surface 200L of the interposer 200. The level of the top surface 400T of the extension 400G may be lower than a level of the top surface 200T of the interposer 200. For example, the top surface 400T of the extension 400G may be disposed at a level halfway between the level of the top surface 200T of the interposer 200 and the level of the bottom surface 200L of the interposer 200.

The first gap GP1 might be fully filled with the under-fill material through the through hole TH in one or more steps and during these steps, more under-fill material than can be accommodated within the first gap GP1 may be introduced though the trough hole TH and as a result, some of this under-fill material may at least partially fill the through hole TH.

In other embodiments, the level of the top surface 400T of the extension 400G may be the same as or higher than the level of the top surface 200T of the interposer 200. For example, the under-fill layer 400 may fully fill the through hole TH or may cover a portion of the top surface 200T of the interposer 200, which portion of the top surface 200T is in the vicinity of the through hole TH. When the introduced amount of the under-fill material is greater than a required amount for filling the first gap GP1 and the through hole TH, the under-fill layer 400 may partially cover the top surface 200T of the interposer 200.

The under-fill layer 400 may include a dielectric material whose thermal expansion coefficient and viscosity are each different from those of the lower molding member 130. The under-fill layer 400 may include, for example, an epoxy molding compound (EMC).

Figure 1C:
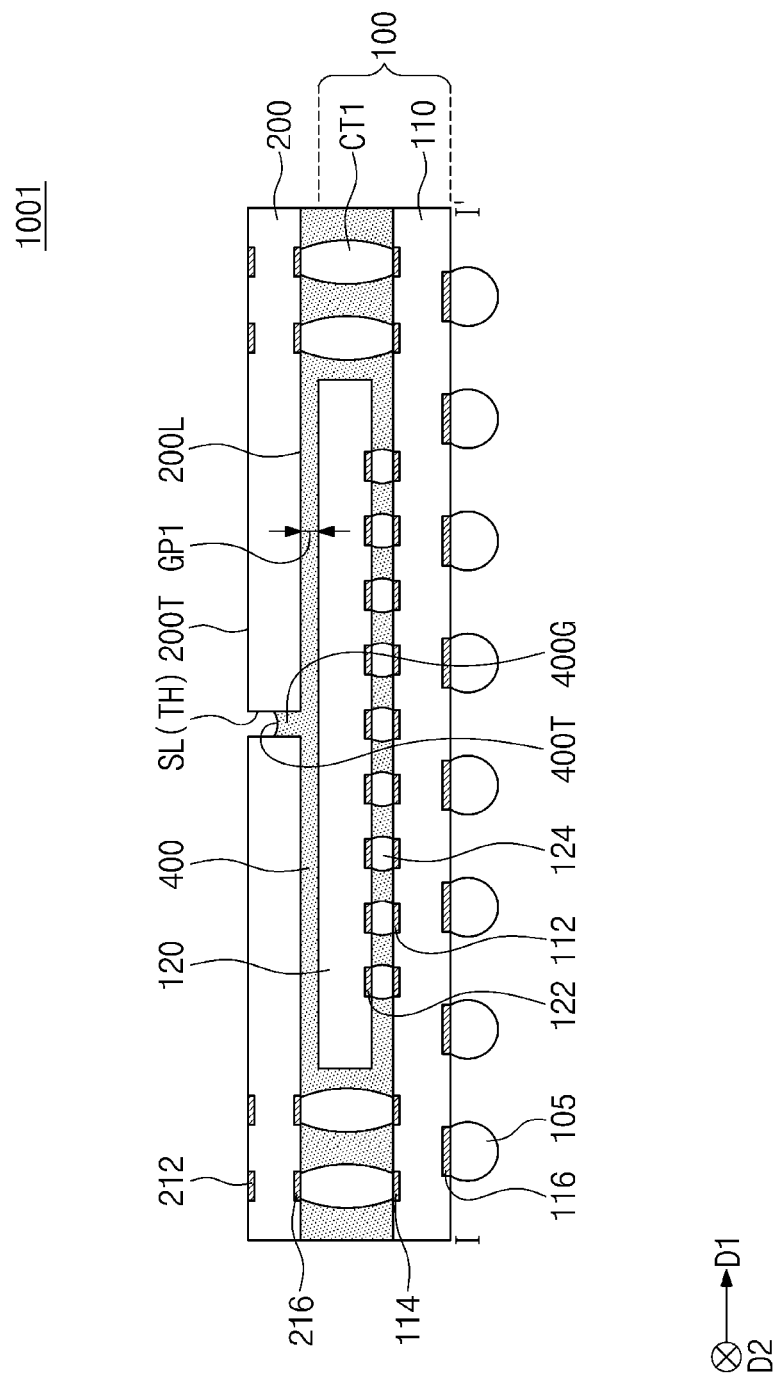
FIG. 1C is a cross-sectional view taken along line I-I' of FIG. 1A.

FIG. 1C is a cross-sectional view taken along line I-I' of FIG. 1A. While some elements shown in FIGS. 1A and 1B may be omitted from FIG. 1C for the purpose of providing a clear illustration, it is to be understood that each of the elements shown in FIGS. 1A and 1B (or a corresponding version thereof) may be included within the structure of FIG. 1C. Thus, the structure of FIG. 1C may be described herein with respect to those elements that differ from those discussed above with respect to FIGS. 1A and 1B and it may be assumed that to the extent that some elements are not illustrated or discussed with respect to FIG. 1A, these elements may be at least similar to corresponding elements that have already been discussed with respect to the other figures.

Referring to FIGS. 1A and 1C, in comparison with the semiconductor package 1000 of FIG. 1B, a semiconductor package 1001, according to some embodiments of the present inventive concepts, may be configured such that the lower molding member 130 is omitted, and that the under-fill layer 400 extends to fill a space where the lower molding member 130 is absent.

For example, the under-fill layer 400 may be disposed between the interposer 200 and the lower package substrate 110. The under-fill layer 400 may at least partially cover the top surface of the lower package substrate 110, the top and lateral surfaces of the lower semiconductor chip 120, the lateral surfaces of the chip terminals 124, and the lateral surfaces of the first connection terminals CT1. The under-fill layer 400 may fill the first gap GP1 between the interposer 200 and the lower package 100, a space between the first connection terminals CT1, and a space between the chip terminals 124.

Figure 2A:
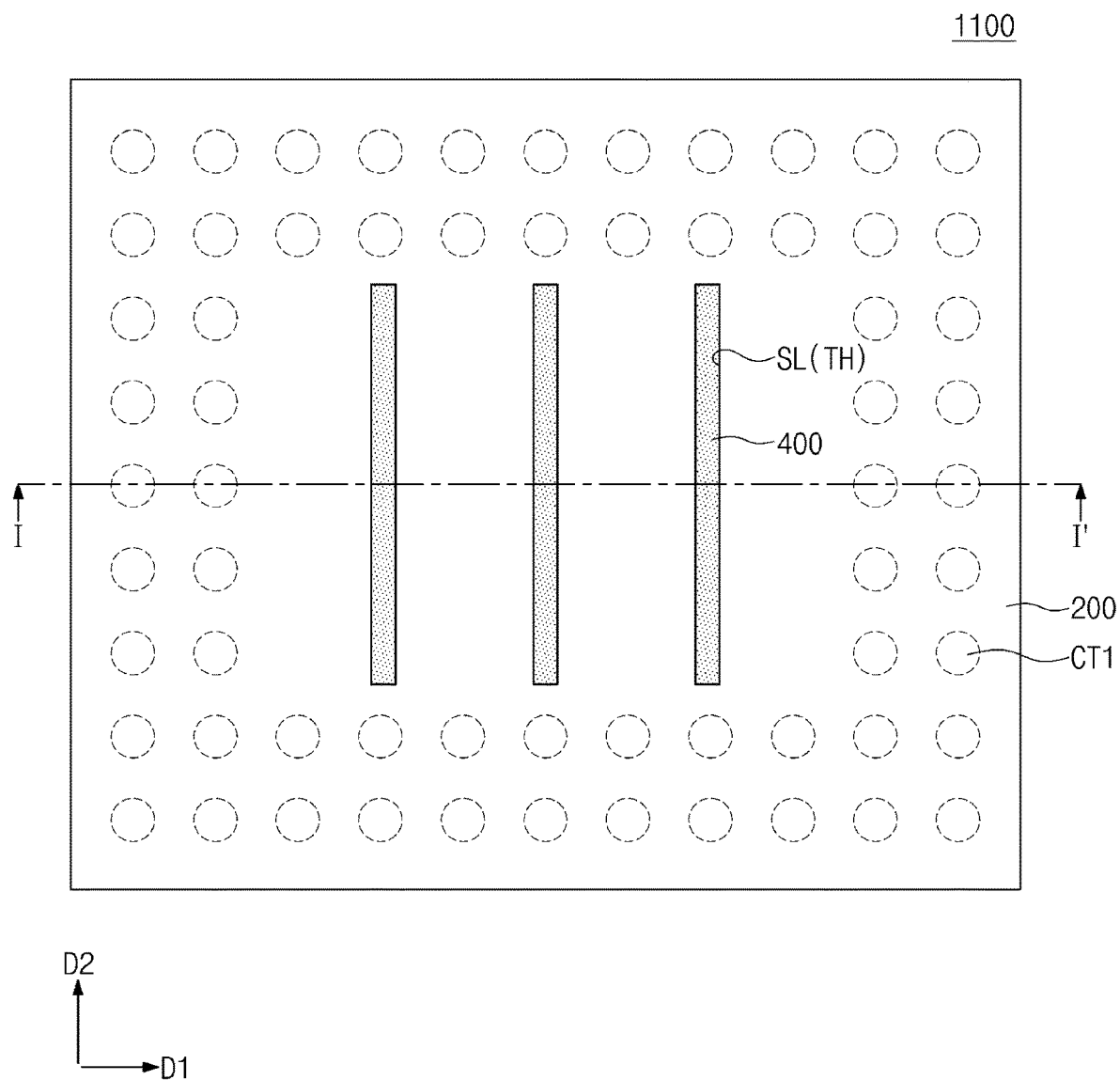
FIG. 2A is a plan view illustrating a semiconductor package according to some example embodiments of the present inventive concepts.
Figure 2B:
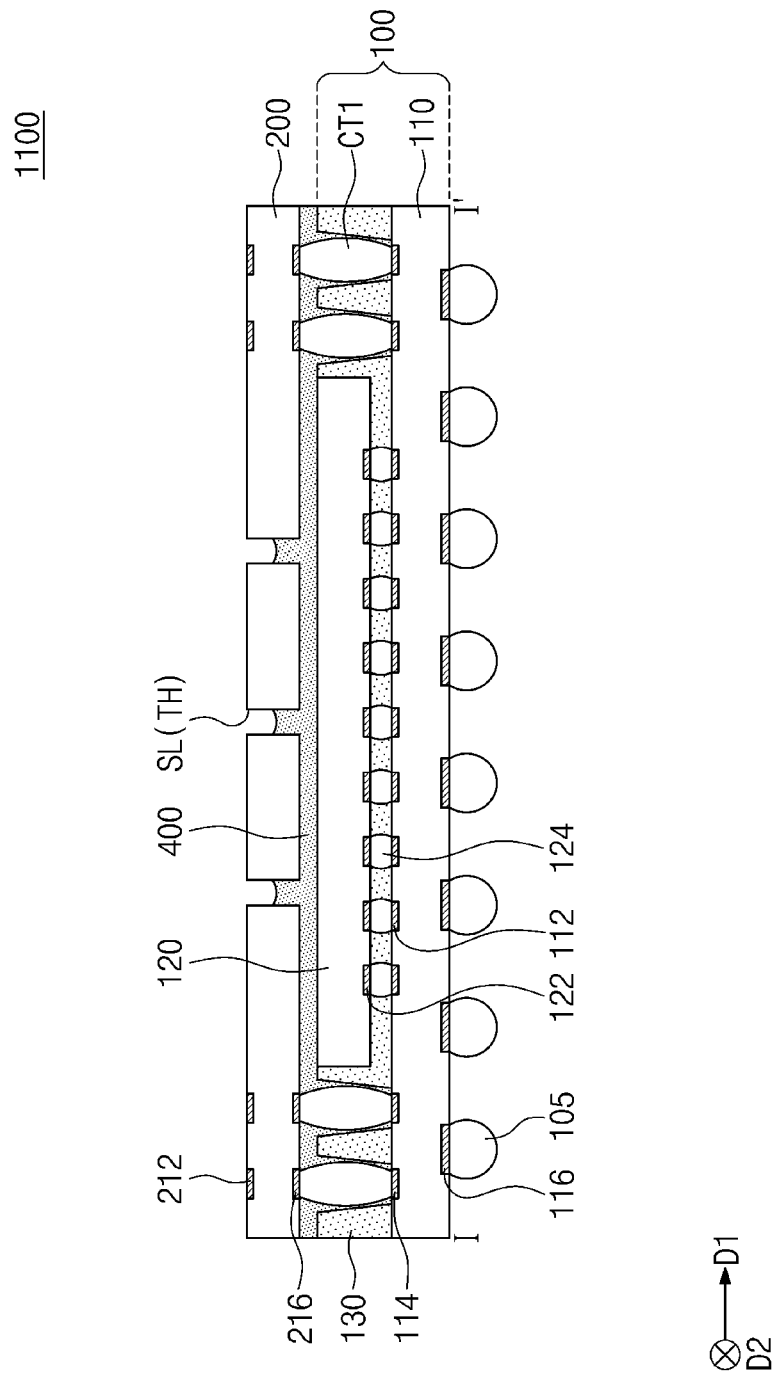
FIG. 2B is a cross-sectional view taken along line I-I' of FIG. 2A.

FIG. 2A is a plan view illustrating a semiconductor package according to some example embodiments of the present inventive concepts. FIG. 2B illustrates a cross-sectional view taken along line I-I' of FIG. 2A. For clarity of the present inventive concepts, some components of FIG. 2B will be omitted in FIG. 2A. However, it is to be understood that each of the elements shown in one figure may be present in the structure that is shown in the other figure. Except for the following description, those discussed in detail with reference to FIGS. 1A and 1B will be omitted below and to the extent that elements are omitted, it may be understood that these elements are at least similar to corresponding elements illustrated and described elsewhere in the instant specification.

Referring to FIGS. 2A and 2B, a semiconductor package 1100, according to some example embodiments, may include the interposer 200 having a plurality of through holes TH. Each of the plurality of through holes TH may be, for example, the slit SL. The plurality of slits SL may be spaced apart from each other along the first direction D1. When an under-fill material is introduced into the plurality of slits SL, the under-fill material may uniformly fill the first gap GP1 and suppress the creation of voids therein.

Figure 3A:
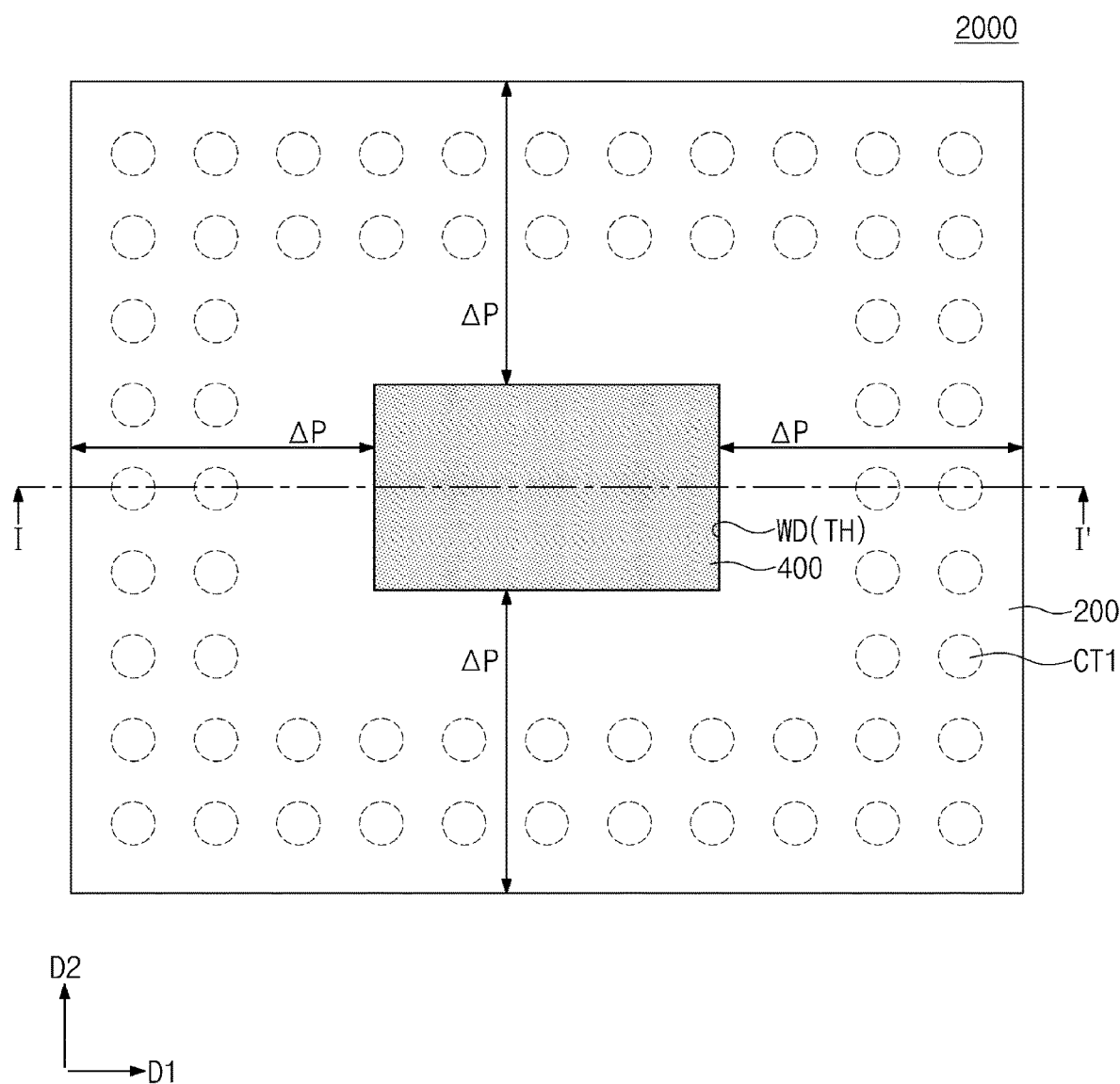
FIG. 3A is a plan view illustrating a semiconductor package according to some example embodiments of the present inventive concepts.
Figure 3B:
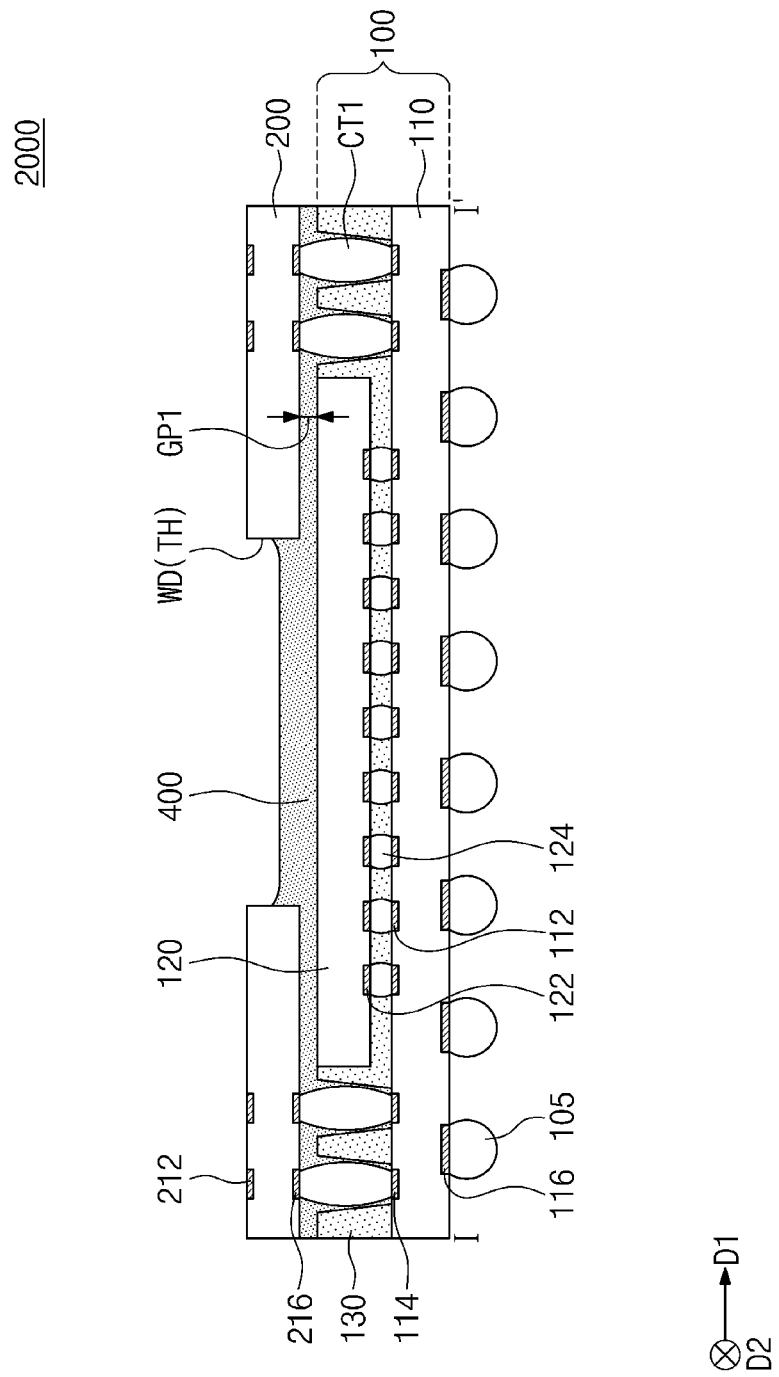
FIG. 3B is a cross-sectional view taken along line II-II' of FIG. 3A.

FIG. 3A is a plan view illustrating a semiconductor package according to some example embodiments of the present inventive concepts. FIG. 3B illustrates a cross-sectional view taken along line I-I' of FIG. 3A. For clarity of the present inventive concepts, some components of FIG. 3B will be omitted in FIG. 3A. However, once again, it may be assumed that the omitted elements are present in the illustrated structure and they are at least similar in description to corresponding elements described elsewhere in the instant specification. Except for the following description, those discussed in detail with reference to FIGS. 1A and 1B will be omitted below.

Referring to FIGS. 3A and 3B, a semiconductor package 2000, according to some example embodiments, may include the interposer 200 whose through hole TH has a tetragonal shape WD in cross-section. The through hole TH is not limited to the tetragonal shape WD, and a different shape, such as a circular shape, may be given to the through hole TH.

The through hole TH having the tetragonal shape WD may have sides each of which is parallel to an adjacent side of the interposer 200. For example, the through hole TH having the tetragonal shape WD may have the same aspect ratio as that of the interposer 200. In other embodiments, the through hole TH having the tetragonal shape WD may have various aspect ratios.

The same interval ΔP may be provided between the sides of the interposer 200 and their respective adjacent sides of the through hole TH having the tetragonal shape WD. When an under-fill material is introduced into the through hole TH, the time required for the under-fill material to reach an outer edge of the interposer 200 may be adjusted to be substantially the same due to the identical interval ΔP. Therefore, the under-fill material may uniformly fill the first gap GP1, and as a result, the creation of voids therein may be suppressed.

Figure 4:
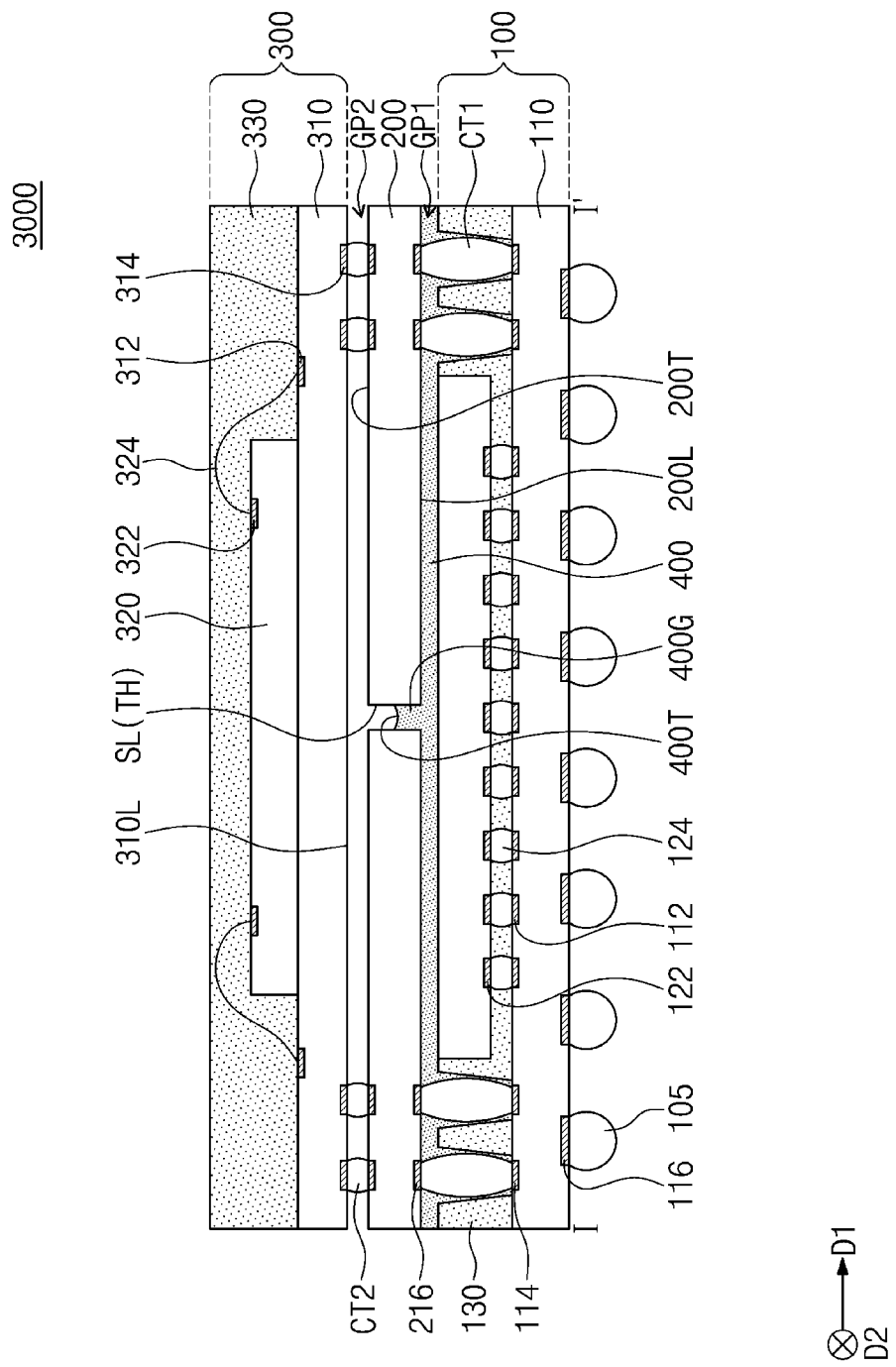
FIG. 4 is a cross-sectional view illustrating a semiconductor package according to some example embodiments of the present inventive concepts.

FIG. 4 is a cross-sectional view illustrating a semiconductor package according to some example embodiments of the present inventive concepts. Except for the following description, those discussed in detail with reference to FIGS. 1A and 1B will be omitted below. However, once again, it may be assumed that the omitted elements are present in the illustrated structure and they are at least similar in description to corresponding elements described elsewhere in the instant specification.

Referring to FIG. 4, in comparison with the semiconductor package 1000 of FIG. 1B, a semiconductor package 3000, according to some embodiments, may further include an upper package 300.

The upper package 300 may be disposed on the interposer 200. The upper package 300 may include an upper package substrate 310, an upper semiconductor chip 320, and an upper molding member 330.

The upper package substrate 310 may be disposed on the interposer 200. The upper package substrate 310 may be vertically spaced apart from the interposer 200. A second gap GP2 may be present between the upper package substrate 310 and the interposer 200. Compared to the first gap GP1 filled with the under-fill layer 400, the second gap GP2 might not be filled with a molding material such as an under-fill material. The uppermost part 400T of the under-fill layer 400, or the top surface 400T of the extension 400G may be located at a lower level than that of a bottom surface 310L of the upper package substrate 310.

The upper package substrate 310 may be a printed circuit board (PCB) with signal patterns disposed thereon. Alternatively, the upper package substrate 310 may have a structure in which at least one dielectric layer and at least one wiring layer are alternately stacked.

Second connection terminals CT2 may be disposed below the upper package substrate 310. The second connection terminals CT2 may be coupled to first upper substrate pads 314 on a lower portion of the upper package substrate 310. The second connection terminals CT2 may be coupled to the second pads 212 on the upper portion of the interposer 200. The second connection terminals CT2 may include solder balls or solder bumps.

In a plan view, the second connection terminals CT2 may surround the through hole TH. The second connection terminals CT2 might not be in contact with the under-fill layer 400.

At least one upper semiconductor chip 320 may be disposed on the upper package substrate 310. The upper semiconductor chip 320 may have a bottom surface that faces toward the upper packages substrate 310 and a top surface opposite to the bottom surface. The bottom surface of the upper semiconductor chip 320 may be an inactive surface, and the top surface of the upper semiconductor chip 320 may be an active surface. The upper semiconductor chip 320 may be mounted on a top surface of the upper package substrate 310. For example, the upper semiconductor chip 320 may be wire-bonding mounted on the upper package substrate 310. For example, the upper semiconductor chip 320 may be electrically connected to the upper package substrate 310 through one or more bonding wires 324. The bonding wire 324 may electrically connect a second upper substrate pad 312 provided on the top surface of the upper package substrate 310 to an upper chip pad 322 provided on the top surface of the upper semiconductor chip 320.

Although not shown, the upper semiconductor chip 320 may be attached through an adhesive layer to the top surface of the upper package substrate 310. The present inventive concepts, however, are not limited thereto, and the upper semiconductor chip 320 may be flip-chip mounted on the upper package substrate 310. The upper semiconductor chip 320 may be, for example, a memory chip. The memory chip may be, for example, dynamic random access memory (DRAM), NAND Flash, NOR Flash, phase-change RAM (PRAM), resistive RAM (ReRAM), or magnetoresistive RAM (MRAM).

The upper semiconductor chip 320 may be electrically connected through the upper package substrate 310 and the interposer 200 to the external terminals 105 of the lower package substrate 110. FIG. 4 shows only one upper semiconductor chip 320, but two or more upper semiconductor chips 320 may be provided. In addition, the upper semiconductor chip 320 is illustrated to rest on a central portion of the upper package substrate 310, but the upper semiconductor chip 320 may be otherwise disposed in the vicinity of an edge portion of the upper package substrate 310.

The upper molding member 330 may be provided on the upper package substrate 310. The upper semiconductor chip 320 may be surrounded by the upper molding member 330 on the top surface of the upper package substrate 310. The upper molding member 330 may cover top and lateral surfaces of the upper semiconductor chip 320. For example, the upper semiconductor chip 320 may be embedded in the upper molding member 330 on the upper package substrate 310.

Figure 5:
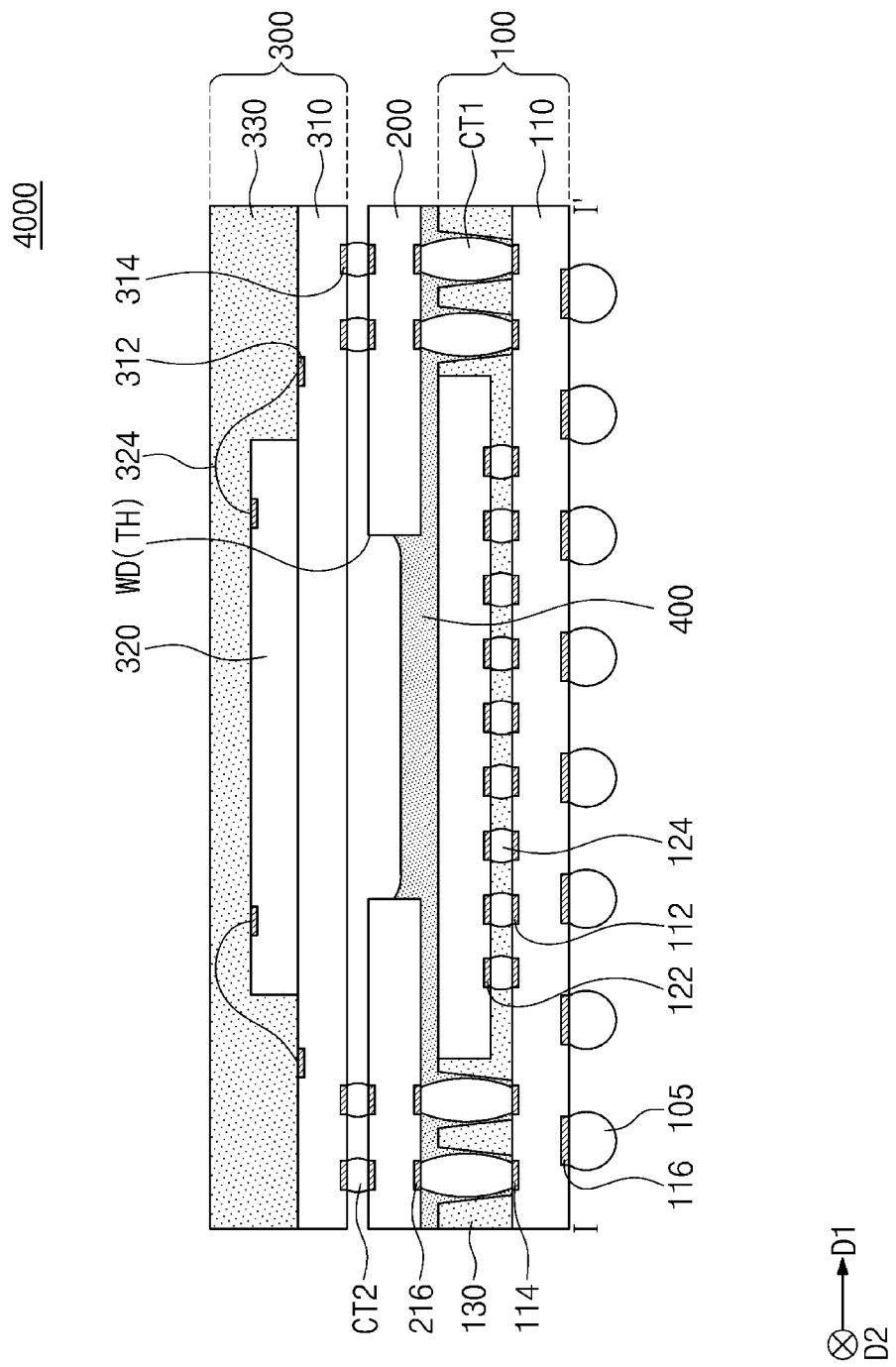
FIG. 5 is a cross-sectional view illustrating a semiconductor package according to some example embodiments of the present inventive concepts.

FIG. 5 is a cross-sectional view illustrating a semiconductor package according to some example embodiments of the present inventive concepts. Except for the following description, those discussed in detail with reference to FIGS. 3A and 3B will be omitted below. However, once again, it may be assumed that the omitted elements are present in the illustrated structure and they are at least similar in description to corresponding elements described elsewhere in the instant specification.

Referring to FIG. 5, in comparison with the semiconductor package 2000 of FIG. 3B, a semiconductor package 4000, according to some embodiments, may further include an upper package 300.

In general, one or both of the lower and upper packages 100 and 300 may undergo warpage caused by heat generated when a semiconductor package is fabricated or practically used. For example, one or both of the lower and upper packages 100 and 300 may be warped to have at their center a concavely U-shape, so as to bow downwardly towards the lower package substrate 110, or a convex U-shape, so as to bulge upwardly away from the lower package substrate 110.

The warpage of a semiconductor package may be alleviated by the under-fill layer 400 that fills a space between the interposer 200 and the lower package 100. The under-fill layer 400 may have a thermal expansion coefficient different from those of the lower and upper packages 100 and 300. The under-fill layer 400 may have a thermal expansion coefficient that is capable of compensating for warpage of one or both of the lower and upper packages 100 and 300. For example, the under-fill layer 400 may compensate for a difference in thermal expansion coefficient between upper and lower portions of a semiconductor package. As a result, semiconductor packages, according to some example embodiments of the present inventive concepts, may be less susceptible to warpage due to heat, thereby increasing their structural stability.

At least one upper semiconductor chip 320 may be disposed on the upper package substrate 310.

FIGS. 6A to 6D are cross-sectional views illustrating a method of fabricating a semiconductor package according to some example embodiments of the present inventive concepts.

Figure 6A:
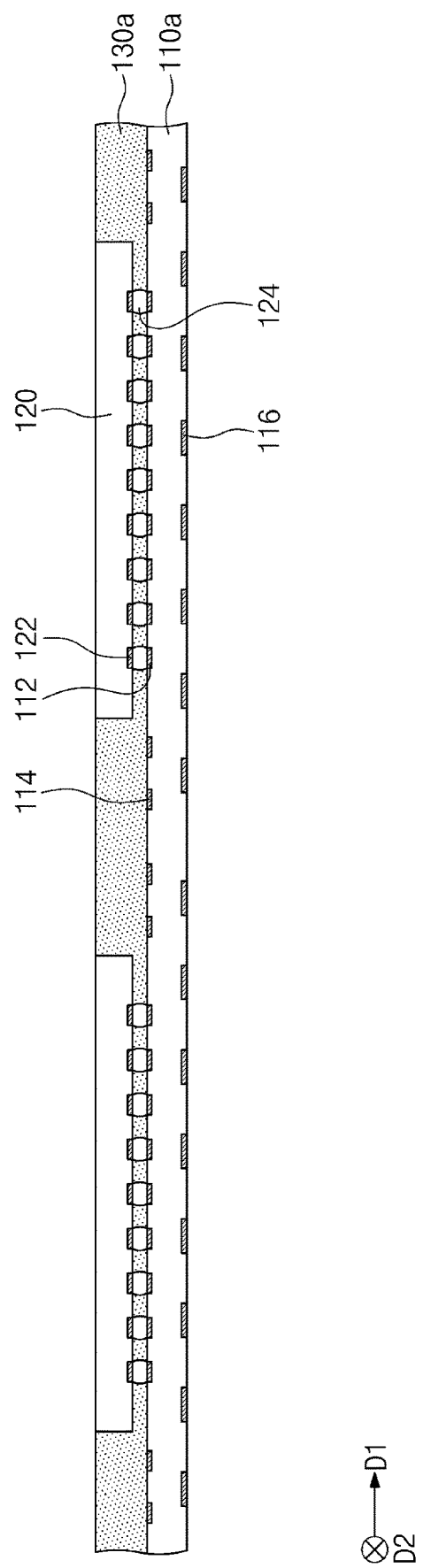
FIGS. 6A to 6D are cross-sectional views illustrating a method of fabricating a semiconductor package according to some example embodiments of the present inventive concepts.

Referring to FIG. 6A, a substrate 110a may be provided. The substrate 110a may be formed into a plurality of lower package substrates (see 110 of FIG. 6D) in a subsequent sawing process. The substrate 110a may include components of the lower package substrate 110. For example, the substrate 110a may include first lower substrate pads 112 and second lower substrate pads 114 on a top surface thereof. The substrate 110a may also include external terminal pads 116 on a bottom surface thereof. A plurality of lower semiconductor chips 120 may be mounted on the substrate 110a. Each of the lower semiconductor chips 120 may include lower chip pads 122 on a bottom surface thereof. For example, each of the lower semiconductor chips 120 may be flip-chip mounted on the substrate 110a. A lower molding layer 130a may be formed to surround the lower semiconductor chips 120. The lower molding layer 130a may encapsulate chip terminals 124 formed between the lower chip pads 122 and the first lower substrate pads 112. A molding material may be coated on the substrate 110a, and then cured to form the lower molding layer 130a. In other embodiments, the formation of the lower molding layer 130a may be omitted.

Figure 6B:
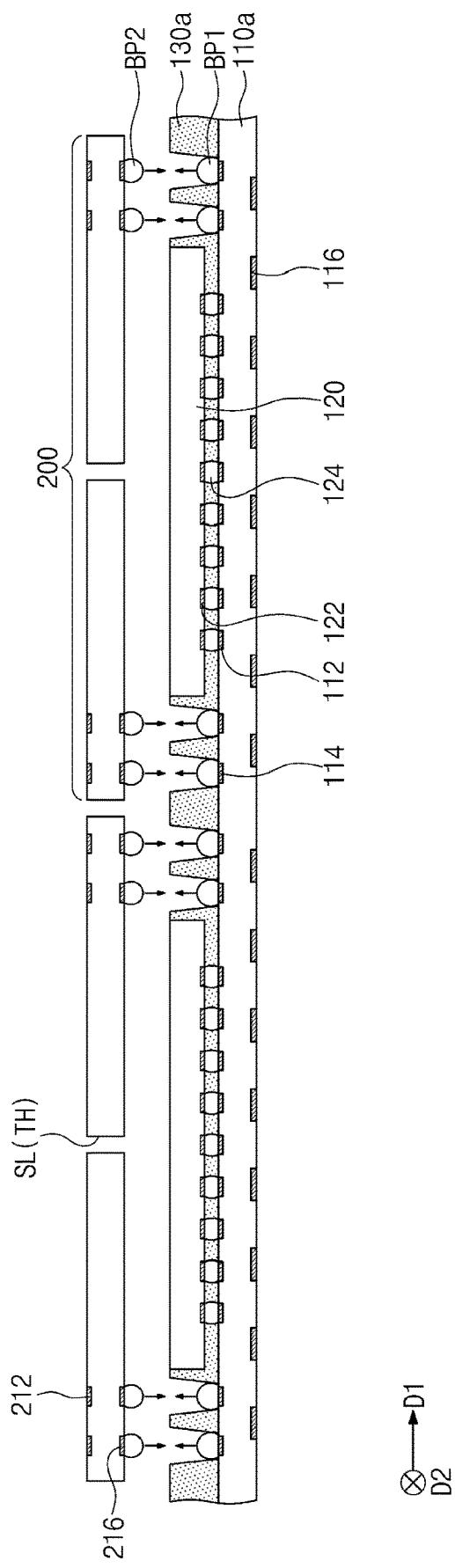

Referring to FIG. 6B, openings OP may be formed to expose the second lower substrate pads 114 of the substrate 110a. The openings OP may be formed by, for example, laser drilling. First bumps BP1 may be formed on the exposed second lower substrate pads 114.

A plurality of interposers 200, each of which includes a through hole TH at a central portion thereof, may be mounted on the lower semiconductor chips 120 and the lower molding layer 130a. The through hole TH of each of the interposers 200 may be formed by laser drilling or mechanical drilling.

Each of the interposers 200 may be vertically spaced apart from the lower semiconductor chip 120 and the lower molding layer 130a. Each of the interposers 200 may include first pads 216 on a bottom surface thereof and second pads 212 on a top surface thereof.

Second bumps BP2 may be formed on the first pads 216 of the interposer 200. The second bumps BP2 may be aligned with corresponding first bumps BP1. Afterwards, a reflow process may be performed to mount the interposer 200 on the lower semiconductor chip 120 and the lower molding layer 130a. The first bumps BP1 and the second bumps BP2 may form first connection terminals (see CT1 of FIG. 6C).

Figure 6C:
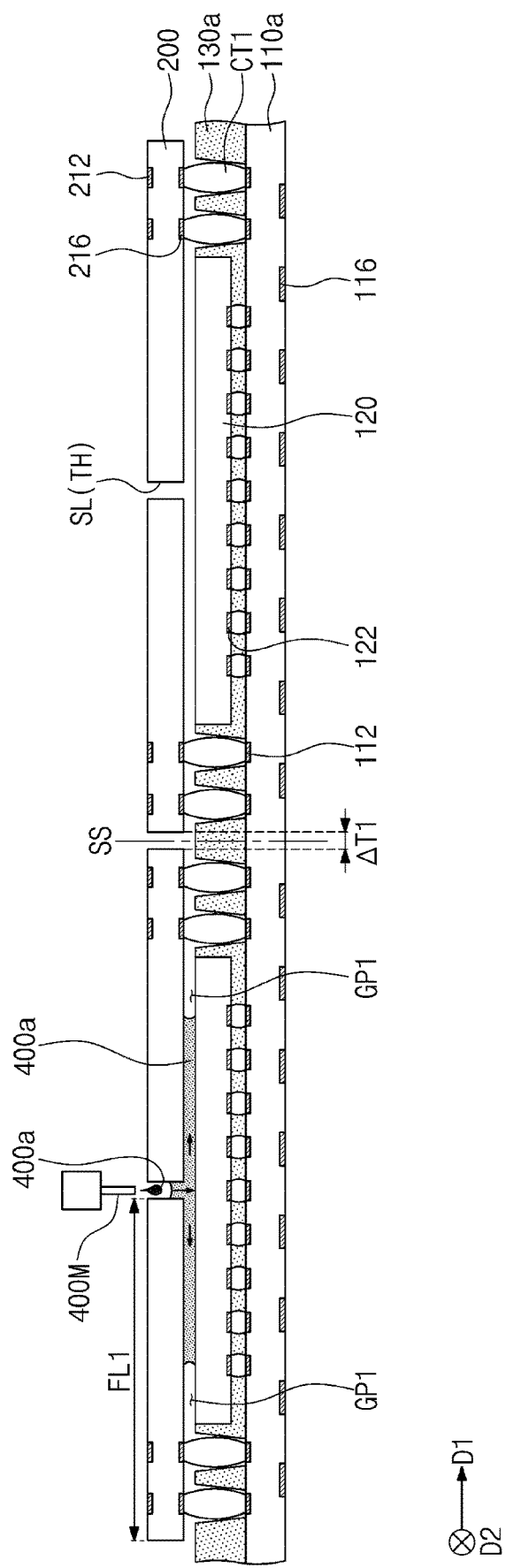

Referring to FIG. 6C, a needle 400M may be used to introduce an under-fill material 400a to fill a gap between the interposer 200 and the lower molding layer 130a. The through hole TH may receive the under-fill material 400a that is introduced along an arrow indicating a direction toward the substrate 110a from the top surface of the interposer 200. Before the under-fill material 400a is introduced, the substrate 110a may be thermally treated to allow the under-fill material 400a to flow smoothly. Capillary action may cause the under-fill material 400a to travel to an edge of the interposer 200. When the under-fill material 400a reaches a lateral surface of the interposer 200, introduction of the under-fill material 400a may be interrupted.

The under-fill material 400a may fill a first gap GP1 between the interposer 200 and the lower molding layer 130a and between the interposer 200 and the lower semiconductor chip 120. The introduction of the under-fill material 400a may be stopped before the through hole TH is completely filled with the under-fill material 400a. Therefore, the under-fill material 400a may be prevented from flowing outside of a semiconductor package, and as a result, it is possible to avoid unnecessary use of the under-fill material 400a.

A portion of the under-fill material 400a may pass through the through hole TH and may then flow onto the bottom surface of the interposer 200. Between the interposer 200 and the lower molding layer 130a, the under-fill material 400a may flow toward the edge of the interposer 200.

In some embodiments, when the lower molding layer 130a is not formed, the under-fill material 400a may additionally cover a lateral surface of the lower semiconductor chip 120 and lateral surfaces of the chip terminals 124. As shown in FIG. 1C, the under-fill material 400a may fill a space between the first connection terminals CT1, a space between the chip terminals 124, and a space between the lower semiconductor chip 120 and a lower package substrate 110 which will be discussed below.

According to the present inventive concepts, it is possible to produce a greater number of unit packages per unit area of the substrate 110a when the under-fill material 400a is introduced into a central portion of the interposer 200, as compared to the case where an under-fill material is introduced into an edge portion of the interposer 200. When an under-fill material is introduced into the edge portion of the interposer 200, it may be necessary to provide a certain interval between neighboring interposers 200. For example, it may be needed to prepare a space for the access of a needle used to introduce the under-fill material 400a. Therefore, by arranging the structure to allow for the under-fill material 400a to be introduced into a central portion of the interposer 200, the total size of the structure may be further reduced.

According to the present inventive concepts, because the under-fill material 400a is introduced into the through hole TH of the interposer 200, it may be unnecessary for the interposers 200 to have therebetween a space to which the needle 400M advances, which may result in a reduction in an interval ΔT1 between the interposers 200. The interval ΔT1 between the interposers 200 may be less than about 4 mm, for example, may be about 2.8 mm. The reduction in the interval ΔT1 between the interposers 200 may allow for a greater number of the lower semiconductor chips 120 to be mounted on a unit area of the substrate 110a. As a result, it is possible to produce a larger number of unit packages per unit area of the substrate 110a.

Moreover, because the under-fill material 400a is introduced into the through hole TH positioned at the central portion of the interposer 200, the under-fill material 400a may have a reduced flow length FL1. The under-fill material 400a may then have low flow resistance and may easily flow. Accordingly, compared to the case where an under-fill material is introduced into an edge portion of the interposer 200, the under-fill material 400a may easily move to decrease the creation of voids therein. After the under-fill material 400a is introduced, a curing process may be performed. The under-fill material 400a may be cured to form an under-fill layer (see 400 of FIG. 6D).

After the curing process, a sawing action SS may be performed which vertically runs across the interposers 200. The sawing action SS may cut the lower molding layer 130a and the substrate 110a, thereby forming a plurality of lower packages (see 100 of FIG. 6D). The lower molding layer 130a may be cut into a plurality of lower molding members (see 130 of FIG. 6D), and the substrate 110a may be cut into a plurality of lower package substrates (see 110 of FIG. 6D).

Figure 6D:
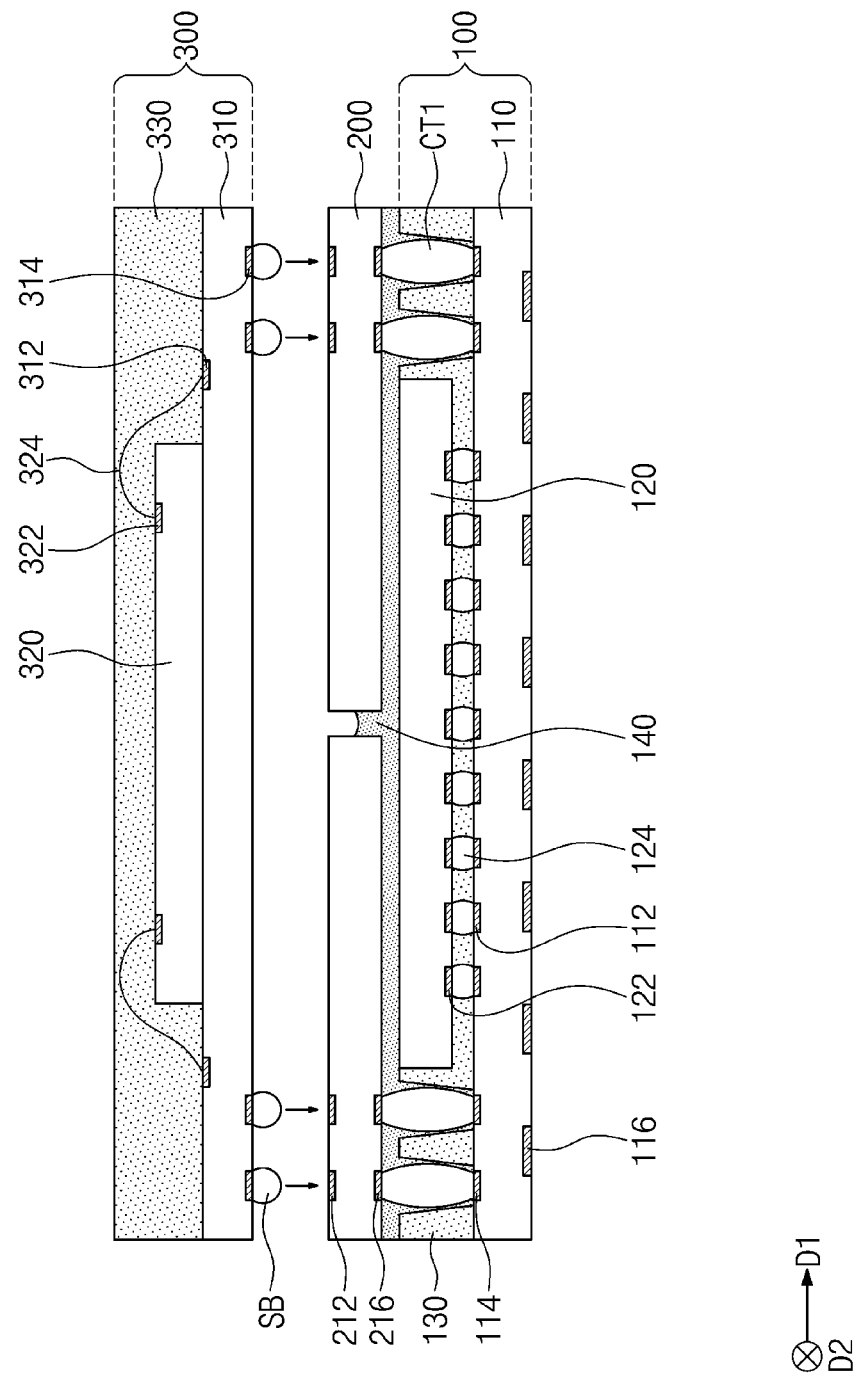

Referring to FIGS. 4 and 6D, an upper package 300 may be mounted on each of the plurality of lower packages 100. The upper package 300 may include an upper package substrate 310 having a first upper substrate pad 314 on a bottom surface thereof and a second upper substrate pad 312 on a top surface thereof, an upper semiconductor chip 320 having an upper chip pad 322 on a top surface thereof, and an upper molding member 330 that covers the upper semiconductor chip 320. The upper semiconductor chip 320 and the upper package substrate 310 may be electrically connected to each other through a bonding wire 324 coupled to the upper chip pad 322 and the second upper substrate pad 312. Solder balls SB below the upper package 300 may be connected to the interposer 200. A reflow process may be performed on the solder balls SB to form second connection terminals CT2. At this stage, the upper package substrate 310 may be spaced apart from the top surface of the interposer 200. Thereafter, as shown in FIG. 1B, external terminals 105 may be formed on a bottom surface of the lower package substrate 110.

Figure 7A:
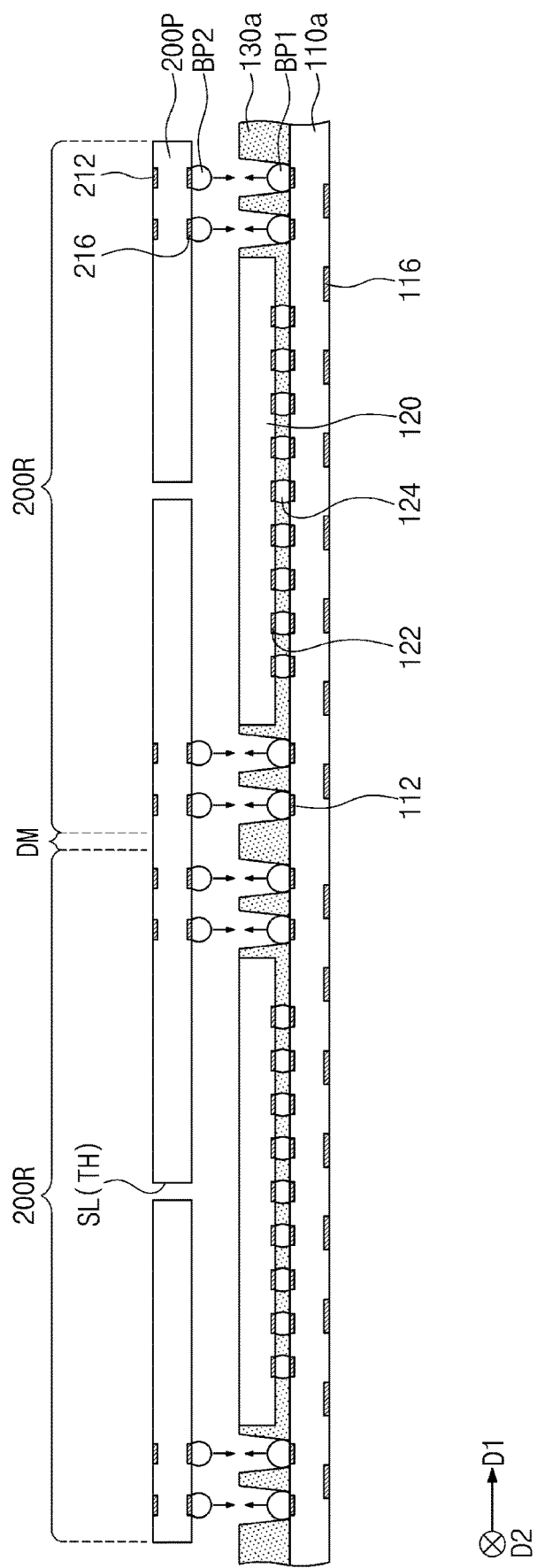
FIGS. 7A and 7B are cross-sectional views illustrating a method of fabricating a semiconductor package according to some example embodiments of inventive concepts and FIG. 8 is a cross-sectional view according to a comparative example.
Figure 7B:
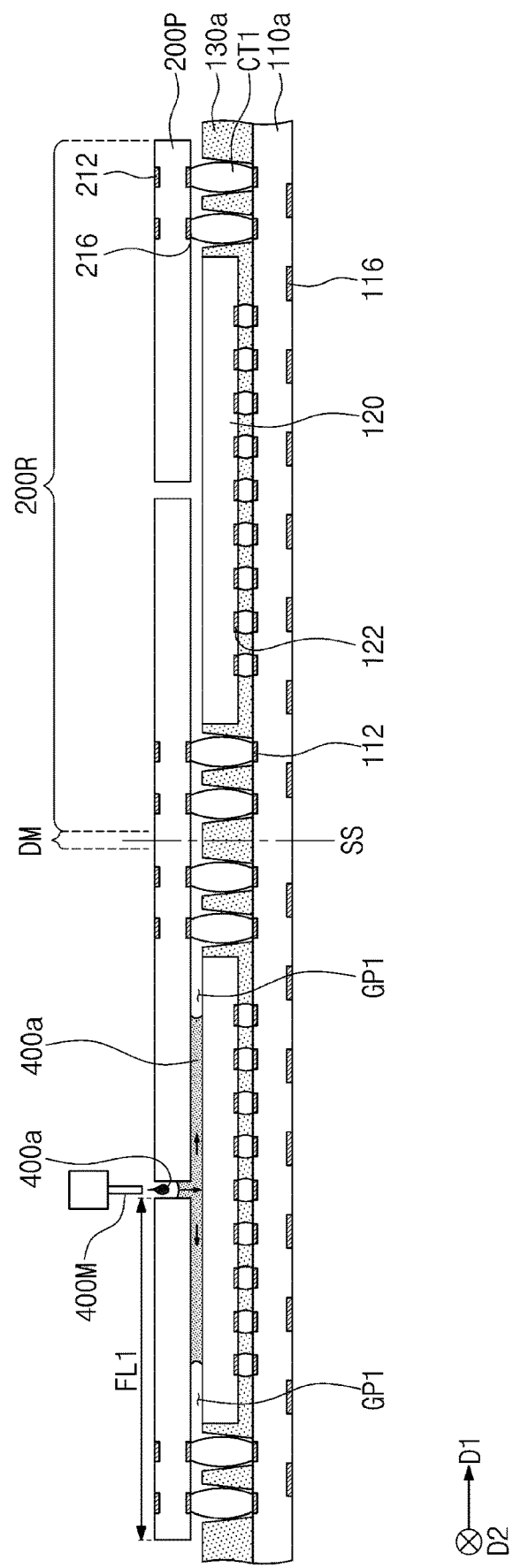

FIGS. 7A and 7B are cross-sectional views illustrating a method of fabricating a semiconductor package according to some exemplary embodiments of the present inventive concepts.

Referring to FIGS. 6A and 7A, an intermediate substrate 200P may be provided which includes a plurality of regions 200R that will become the interposers 200 and a dummy region DM between the plurality of regions 200R. The intermediate substrate 200P may be mounted on the lower semiconductor chips 120 and the lower molding layer 130a. Like the interposer 200 of FIG. 6B, the intermediate substrate 200P may include first pads 216 on its bottom surface on the region 200R and second pads 212 on its top surface on the region 200R.

Referring to FIG. 7B, the under-fill material 400a may be introduced to fill a gap (e.g., corresponding to the first gap GP1) between the intermediate substrate 200P and the lower molding layer 130a. The through hole TH may receive the under-fill material 400a that is introduced along an arrow indicating a direction toward the substrate 110a from a top surface of the intermediate substrate 200P. After the under-fill material 400a is introduced, a curing process may be performed. The under-fill material 400a may be cured to form the under-fill layer 400.

After the curing process, a sawing action SS may be performed which vertically runs across the dummy region DM of the intermediate substrate 200P, the lower molding layer 130a that vertically overlaps the dummy region DM, and the substrate 110a that vertically overlaps the dummy region DM. The sawing action SS may cut the intermediate substrate 200P to form a plurality of interposers 200. The sawing action SS may remove at least a portion of the dummy region DM. After that, the lower molding layer 130a and the substrate 110a may be cut to form a plurality of lower packages 100. The upper package 300 may be mounted on each of the plurality of interposers 200.

Figure 8:
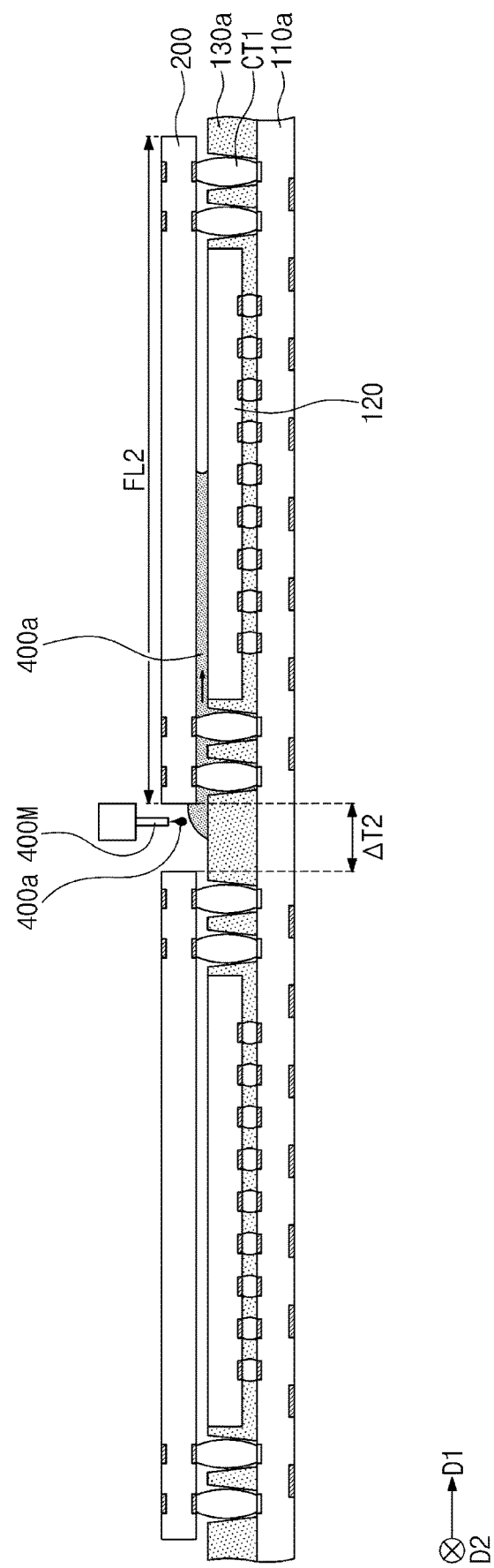

In contrast, when an under-fill material is not introduced into the central portion of the interposer 200 but is rather introduced into the edge portion of the interposer 200, voids may occur between the interposer 200 and the lower package 100. FIG. 8 is a cross-sectional view illustrating a method of fabricating a semiconductor package to which the through hole TH is not provided.

Referring to FIG. 8, as indicated by arrows showing the direction of flow of the under-fill material 400a, the under-fill material 400a may be introduced from the edge of the interposer 200 toward a gap between the interposer 200 and the lower semiconductor chip 120 and between the interposer 200 and the lower molding layer 130a.

The under-fill material 400a may flow from one side toward another side of the interposer 200. In this case, the under-fill material 400a may have an increased flow length FL2 and high flow resistance. Therefore, the under-fill material 400a may overflow at one side of the interposer 200, which one side serves as an entrance through which the under-fill material 400a is introduced, and voids may occur between the interposer 200 and the substrate 110a.

In addition, because a space for the access of the needle 400M used to introduce the under-fill material 400a needs to be provided, it may be necessary to provide an interval ΔT2 between adjacent interposers 200. For example, the interval ΔT2 between the interposers 200 may be about 5 mm. In this case, a smaller number of unit packages may be produced per unit area of the substrate 110a.

A semiconductor package, according to some example embodiments of the present inventive concepts, may include an under-fill layer that is capable of compensating for a difference in thermal expansion coefficient between upper and lower portions of the semiconductor package. Therefore, the semiconductor package may see decreases in heat-induced warpage and increases in structural stability. Moreover, the under-fill layer may efficiently radiate heat generated from a lower semiconductor chip and may rigidly attach an interposer and a lower package to each other.

A method of fabricating a semiconductor package, according to some example embodiments of the present inventive concepts, may allow an under-fill material to more easily flow along a gap between the interposer and the lower package. Therefore, voids may be less likely to occur between the interposer and a lower molding member. Moreover, because an entrance for the introduction of the under-fill material is positioned at a location other than an edge portion of the interposer, a reduced interval may be provided between the interposers, which may increase the number of unit packages produced per unit area of a substrate.

Although the present invention has been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a lower package;
a lower semiconductor chip disposed over the lower package;
an interposer disposed on the lower package and over the lower semiconductor chip; and
an under-fill layer disposed between the interposer and the lower package,
wherein a through hole vertically penetrates the interposer and overlaps the lower semiconductor chip, and
wherein the under-fill layer includes an extension that fills at least a portion of the through hole over the lower semiconductor chip.

2. The semiconductor package of claim 1, further comprising a plurality of first connection terminals disposed between the interposer and the lower package,
wherein the plurality of first connection terminals electrically connect the interposer to the lower package, and
wherein, in a plan view, the through hole is surrounded by the plurality of first connection terminals.

3. The semiconductor package of claim 2, wherein the through hole is disposed at a central portion of the interposer.

4. The semiconductor package of claim 2, wherein the under-fill layer covers lateral surfaces of the plurality of first connection terminals.

5. The semiconductor package of claim 1, wherein a bottom surface of the interposer and a top surface of the lower package are spaced apart from each other at an interval within a range of about 0 μm to about 50 μm, inclusive.

6. The semiconductor package of claim 1, wherein the through hole is shaped like a slit, and an aspect ratio of the slit is equal to or greater than about 1:2.

7. The semiconductor package of claim 6, wherein the slit has:
a width in a first direction parallel to a top surface of the interposer; and
a width in a second direction parallel to the top surface of the interposer and perpendicular to the first direction,
wherein the width in the first direction is greater than the width in the second direction, and
wherein the width in the first direction ranges from about 100 μm to about 200 μm, inclusive.

8. The semiconductor package of claim 1, wherein
the through hole has a substantially tetragonal shape, in a plan view, and
substantially the same interval is provided between sides of the through hole and their respective adjacent sides of the interposer.

9. The semiconductor package of claim 1, wherein the under-fill layer is in contact with a bottom surface of the interposer and is also in contact with a top surface of the lower package.

10. The semiconductor package of claim 1, further comprising:
an upper package disposed on the interposer; and
a plurality of second connection terminals disposed between the interposer and the upper package,
wherein the plurality of second connection terminals electrically connect the upper package to the interposer.

11. The semiconductor package of claim 10, wherein, in a plan view, the through hole is surrounded by the plurality of second connection terminals.

12. A semiconductor package, comprising:
a lower package;
a lower semiconductor chip disposed over the lower package;
an upper package disposed on the lower package;
an interposer disposed between the lower package and the upper package, the interposer including at least one through hole that vertically penetrates the interposer and overlaps the lower semiconductor chip; and
an under-fill layer that fills at least a portion of the through hole and also fills a gap between the interposer and the lower package,
wherein an uppermost part of the under-fill layer is exposed through the through hole.

13. The semiconductor package of claim 12, wherein a level of the uppermost part of the under-fill layer is higher than a level of a bottom surface of the interposer.

14. The semiconductor package of claim 13, wherein the level of the uppermost part of the under-fill layer is lower than a level of a bottom surface of the upper package.

15. The semiconductor package of claim 12, further comprising:
a plurality of first connection terminals disposed between the interposer and the lower package; and
a plurality of second connection terminals disposed between the interposer and the upper package,
wherein the plurality of first connection terminals electrically connect the interposer to the lower package,
wherein the plurality of second connection terminals electrically connect the interposer to the upper package,
wherein the under-fill layer covers lateral surfaces of the first plurality of connection terminals, and
wherein the under-fill layer is not in contact with the plurality of second connection terminals.

16. The semiconductor package of claim 12, wherein
the at least one through hole has a plurality of slits, and
an aspect ratio of each of the plurality of slits is equal to or greater than about 1:2.

17. The semiconductor package of claim 12, wherein the lower package includes:
a lower package substrate;
the lower semiconductor chip disposed on the lower package substrate; and
a lower molding member that covers a lateral surface of the lower semiconductor chip, and
the upper package includes:
an upper package substrate;
an upper semiconductor chip disposed on the upper package substrate; and
an upper molding member that covers a top surface and a lateral surface of the upper semiconductor chip,
wherein a material of the under-fill layer is different from a material of the lower molding member and is also different from a material of the upper molding member.

18. The semiconductor package of claim 17, wherein, in the plan view, the at least one through hole overlaps the upper semiconductor chip.

19. A semiconductor package, comprising:
a lower package substrate;
a lower semiconductor chip disposed on the lower package substrate;
a lower molding member that covers a lateral surface of the lower semiconductor chip;

an interposer disposed on the lower semiconductor chip, the interposer including a through hole that vertically penetrates the interposer and overlaps the lower semiconductor chip;

a plurality of first connection terminals disposed between the interposer and the lower package substrate, the plurality of first connection terminals surrounding the lower semiconductor chip; and an under-fill layer that fills a portion of the through hole and covers the plurality of first connection terminals, a top surface of the lower semiconductor chip, and a top surface of the lower molding member.

20. The semiconductor package of claim 19, further comprising:

an upper package substrate disposed on the interposer;

a plurality of second connection terminals disposed between the interposer and the upper package substrate;

an upper semiconductor chip disposed on the upper package substrate; and an upper molding member that covers a top surface and a lateral surface of the upper semiconductor chip.

\* \* \* \* \*